US009881682B1

(12) United States Patent
Tang et al.

(10) Patent No.: US 9,881,682 B1
(45) Date of Patent: Jan. 30, 2018

(54) FINE GRAINED DATA RETENTION MONITORING IN SOLID STATE DRIVES

(71) Applicant: Seagate Technology LLC, Longmont, CO (US)

(72) Inventors: Alex Tang, Cupertino, CA (US); Timothy Canepa, Longmont, CO (US); Ramdas Kachare, Cupertino, CA (US)

(73) Assignee: Seagate Technology LLC, Longmont, CO (US)

( * ) Notice: Subject to any disclaimer, the term of this patent is extended or adjusted under 35 U.S.C. 154(b) by 0 days.

(21) Appl. No.: 15/360,821

(22) Filed: Nov. 23, 2016

(51) Int. Cl.
*G11C 16/04* (2006.01)
*G11C 16/34* (2006.01)
*G11C 11/56* (2006.01)
*G06F 3/06* (2006.01)

(52) U.S. Cl.
CPC ........ *G11C 16/3427* (2013.01); *G06F 3/0619* (2013.01); *G06F 3/0659* (2013.01); *G06F 3/0688* (2013.01); *G11C 11/5628* (2013.01); *G11C 11/5642* (2013.01); *G11C 16/3495* (2013.01)

(58) Field of Classification Search
CPC ............ G11C 16/3427; G11C 11/5628; G11C 11/5642; G11C 16/3495; G06F 3/0619; G06F 3/0659; G06F 3/0688
USPC ................................................... 365/185.02
See application file for complete search history.

(56) References Cited

U.S. PATENT DOCUMENTS

| 5,404,485 A | 4/1995 | Ban |
| 6,763,424 B2 | 7/2004 | Conley |
| 7,325,090 B2 | 1/2008 | Ronen |
| 9,213,633 B2 | 12/2015 | Canepa et al. |
| 9,350,732 B1 | 5/2016 | Bowler |
| 2005/0243626 A1 | 11/2005 | Ronen |
| 2006/0039196 A1 | 2/2006 | Gorobets et al. |
| 2008/0270730 A1 | 10/2008 | Lasser et al. |

(Continued)

OTHER PUBLICATIONS

Changman Lee et al; F2FS: A New File System for Flast Storage; usenix The Advanced Computing Systems Association; https://www.usenix.org/conference/fast15/technical-sessions/presentation/lee; 13th USENIX Conference on File and Storage Technologies (FAST '15), entire document.

(Continued)

*Primary Examiner* — Tha-O H Bui
(74) *Attorney, Agent, or Firm* — Duft Bornsen & Fettig LLP

(57) ABSTRACT

Embodiments described herein provide for linking retention parameters that affect data retention in flash to data stored in the flash. One embodiment includes a flash memory and a controller. The controller receives a plurality of write requests from a host, and stores data for the write request in flash pages of the flash memory along with indicators. The controller identifies at least one retention parameter that affects data retention of the stored data, and adds one or more of the indicators to an entry in a journal along with the at least one retention parameter. In response to determining that a data refresh is warranted based on the at least one retention parameter, the controller identifies the one or more indicators associated with the at least one retention parameter in the entry, locates the stored data corresponding to the one or more indicators, and refreshes the stored data.

27 Claims, 5 Drawing Sheets

(56) References Cited

U.S. PATENT DOCUMENTS

| | | | |
|---|---|---|---|
| 2014/0082459 A1* | 3/2014 | Li | G06F 11/1666 714/773 |
| 2014/0089564 A1 | 3/2014 | Liu et al. | |
| 2014/0325117 A1* | 10/2014 | Canepa | G06F 12/0246 711/103 |
| 2016/0034194 A1 | 2/2016 | Brokhman et al. | |

OTHER PUBLICATIONS

Eran Gai and Sivan Toledo; School of Computer Science, Tel-Aviv University; Algorithms and Data Structures for Flash Memories; Aug. 2005, entire document.

Kawaguchi et al; A Flash-Memory Based File System; Advanced Research Laboratory, Hitachi, Ltd., entire document.

Song Lin et al; Efficient Indexing Data Structures for Flash-Based Sensor Devices; ACM Transactions on Storage, vol. V, No. N Month 20YY, entire document.

Vidy abhushan Mohan et al; refresh SSDs: Enabling High Endurance, Low Cost Flash in Datacenters; Technical Report CS May 2012; May 2012, entire document.

Yixin Luo et al; WARM: Improving NAND Flash Memory Lifetime with Write-hotness Aware Retention Management; Carnegie Mellon University, Dankook University; 2015 IEEE, entire document.

Yu Cai et al; Data Retention in MCL NAND Flash Memory: Characterization, Optimization, and Recovery; Carnegie Mellon University, LSI Corporation, entire document.

Yu Cai et al; Flash Correct-and-Refresh: Retention-Aware Error Management for Increased Flash Memory Lifetime; Carnegie Mellon University, Research Showcase @ CMU; Oct. 2012, entire document.

* cited by examiner

*FIG. 4*

| INDICATOR FIELD 402 | RETENTION PARAMETER FIELD 404 |
|---|---|
| I1 | RP1, RP2, RP3 |
| I2 | RP4 |
| I3 | RP5, RP6 |
|  |  |
| | ⋮ |
| I4, I5 | RP7 |

406 — row I1
407 — row I2
408 — row I3
409 — empty row
410 — ⋮ row
411 — row I4, I5

JOURNAL 124

FINE GRAINED DATA RETENTION MONITORING IN SOLID STATE DRIVES

FIELD

The invention relates generally to storage systems, and more specifically, relates to data retention in flash memories used by solid state disks.

BACKGROUND

Many commonly used data storage devices, such as Solid State Drives (SSDs), are based on flash memory which is a type of Non-Volatile Random Access Memory (NVRAM) capable of storing data even if the power to the device is switched off. A memory cell within a flash memory is typically a floating gate field-effect transistor that holds a charge to indicate stored data. In Single-Level Cell (SLC) flash, the charge indicates one of two possible states ("1" or "0") such that a single memory cell stores one bit of data. By contrast, Multi-Level Cell (MLC) flash uses additional charge states (e.g., "00", "01", "10", or "11") to enable a single memory cell to store two or more bits of data. The storage capacity in MLC flash may therefore be twice (or more) than in SLC flash using the same number of transistors, although there may be other tradeoff considerations such as latency, data retention, and the lifespan of the memory cells. etc.

Because flash stores data within the memory cells using a charge, changes to the charge over time can alter the data represented by the charge in the memory cells. This type of problem is more prevalent in MLC flash, since bit values in a MLC are assigned based on ranges of voltages in the memory cells. The ranges of voltages assigned to a particular bit value become smaller as a MLC stores more bits per memory cell, which can make discriminating the different states more difficult. Also, various activities during operation can disturb the charge stored by the memory cells, including write disturb, read disturb, inherent charge leakage in the cells, repeated write/erase cycles, etc.

One process that is performed to ensure that stored data is not lost is a refresh. During a refresh, data is read from the flash and is re-programmed in another location. A refresh process is typically performed based on the age of the data stored by the memory cells. However, a refresh process utilizes internal resources of the SSD that are therefore not available to service Input/Output (I/O) requests from the host. In addition, a refresh process introduces additional wear on the flash due to write amplification. Therefore, refreshing the data stored in the memory cells utilizing the age of the data may be more conservative than other factors that influence the retention of data in the memory cells.

SUMMARY

Embodiments described herein provide for linking retention parameters that affect data retention in flash to data stored in the flash. One embodiment includes a flash memory and a controller. The controller receives a plurality of write requests from a host, and stores data for the write request in flash pages of the flash memory along with indicators. The controller identifies at least one retention parameter that affects data retention of the stored data, and adds one or more of the indicators to an entry in a journal along with the at least one retention parameter. In response to determining that a data refresh is warranted based on the at least one retention parameter, the controller identifies the one or more indicators associated with the at least one retention parameter in the entry, locates the stored data corresponding to the one or more indicators, and refreshes the stored data.

The various embodiments disclosed herein may be implemented in a variety of ways as a matter of design choice. For example, the embodiments may take the form of physical machines, computer hardware, software, firmware, or combinations thereof. In one embodiment, a computer readable medium is operable to store software instructions for directing the asset insertion into content. These software instructions are configured so as to direct a processor or some other processing system to operate in the manner described above. Other exemplary embodiments are described below.

DESCRIPTION OF THE DRAWINGS

Some embodiments of the present invention are now described, by way of example only, and with reference to the accompanying drawings. The same reference number represents the same element or the same type of element on all drawings.

FIG. 4 illustrates a journal for tracking retention parameters for data written to a flash memory in an exemplary embodiment.

DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
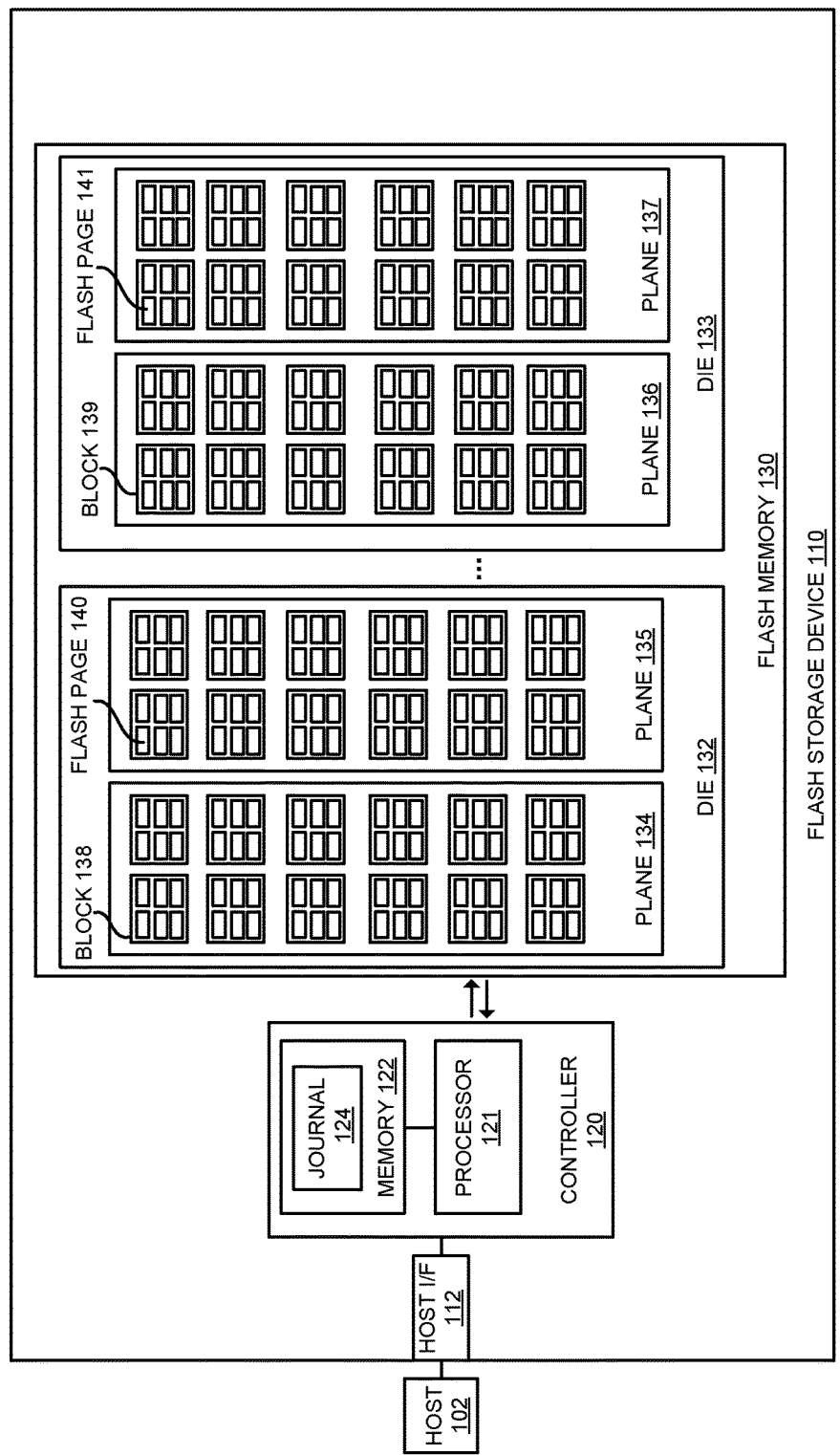
FIG. 1 illustrates a system that includes a flash storage device in an exemplary embodiment.

FIG. 1 illustrates a system 100 that includes a flash storage device 110 in an exemplary embodiment. In this embodiment, system 100 includes a host 102 (e.g., a computer system, a mobile phone, etc.) that issues I/O commands to flash storage device 110. In this embodiment, flash storage device 110 also includes a host interface 112. Host interface 112 provides a communication connection to facilitate communication of data, commands, and/or control signals between host 102 and flash storage device 110. Some examples of Host interface 112 include Small Computer System Interface (SCSI), Serial Attaches SCSI (SAS), Serial AT Attachment (SATA), Fibre Channel (FC), Integrated Drive Electronics (IDE), Peripheral Component Interconnect Express (PCIe), M.2, Universal Serial Bus (USB), Non-Volatile Memory Host Controller Interface Specification (NVMHCI), NVM Express, etc. In this regard, host interface 112 comprises any component, system, or device that allows host 102 to communicate with flash storage device 110.

In this embodiment, flash storage device 110 further includes a controller 120. Controller 120 includes any electronic circuits and/or optical circuits that are able to perform functions. For example, controller 120 may perform any function described herein that is attributed to flash storage device 110. In this regard, controller 120 comprises any system, component, or device that is able to control the operations of flash storage device 110. While the specific hardware implementation of controller 120 is subject to design choices, one particular embodiment may include one or more processors 121 communicatively coupled with a memory 122. Processor 121 includes any electronic circuits and/or optical circuits that are able to perform functions. For example, processor 121 may perform any functionality described herein for controller 120. Processor 121 may include one or more Central Processing Units (CPU), microprocessors, Digital Signal Processors (DSPs), Application-specific Integrated Circuits (ASICs), Programmable Logic Devices (PLD), control circuitry, etc. Some examples of processor 121 include INTEL® CORE™ processors, Advanced Reduced Instruction Set Computing (RISC) Machines (ARM®) processors, etc.

Memory 122 includes any electronic circuits, and/or optical circuits, and/or magnetic circuits that are able to store data. For instance, memory 122 may be used to store programmed instructions that are executed by processor 121 to perform any of the functions described herein for controller 120, may be used to store a journal 124 that will be discussed later, etc. Memory 122 may include one or more volatile or non-volatile Dynamic Random Access Memory (DRAM) devices, flash devices, volatile or non-volatile Static RAM devices, etc. Some examples of non-volatile DRAM and SRAM include battery-backed DRAM and battery-backed SRAM.

In this embodiment, flash storage device 110 further includes a flash memory 130. Flash memory 130 comprises any component, system, or device that is able to store data in a non-volatile manner. Some examples of flash memory 130 include NAND-type flash, NOR-type flash, SLC flash, MLC flash, etc. In some embodiments, flash memory 130 may be used to persistently store journal 124.

In some embodiments, flash memory 130 comprises one or more dies 132-133 (e.g., one, two, four, etc.), each of which may operate independently. Each of dies 132-133 may include one or more planes 134-137 (typically two or four) in which concurrent operations may take place, and each of planes 134-137 may include a number of blocks 138-139 (e.g., dozens or hundreds), which in turn may each contain a number of flash pages 140-141 (e.g., 8, 16, 32, 64, etc.). Generally, in flash architectures, a block (e.g., block 138) represents the smallest unit that may be erased in a single erase operation, and a flash page (e.g., flash page 140) may represent the smallest unit that may be programmed (i.e., written to) or read in a single write or read operation. Each flash page 140 may include thousands or tens of thousands of bits, with each bit implemented by a memory cell.

Memory cells of flash memory 130 may utilize SLC, MLC, or combinations thereof as a matter of design choice. The memory cells of flash memory 130 store one or more bits of data using a floating gate structure that stores an electric charge. The floating gate is surrounded by an insulation layer. To store one or more bits in the floating gate, the floating gate is programmed to a target voltage. However, various processes can occur that unintentionally alters the amount of charge stored on the floating gate. Some of those processes include the inherent charge leakage due to memory cell topology (e.g., insulation layer thickness), temperature induced leakage (e.g., a higher temperature induces a higher leakage current on the floating gate), the program voltage used to program the memory cells, the number of program/erase (p/e) cycles, which degrades the insulation layer around the floating gate, and memory disturbs. One type of memory disturb is a read disturb, which can inject charge into the floating gates of memory cells that share a common bitline when data is read from a memory cell on the bitline. This charge injection increases the voltages on the floating gates of the memory cells, which can push the voltage into a different range of voltages that is used to represent a different bit.

Typically, a decision is made to refresh the data stored in the memory cells that is based on the age of the data in the memory cells and/or based on read disturb effects. For example, a flash die manufacturer may specify a retention age (e.g., 3 months to 1 year), which is used to derive a refresh schedule for data stored in flash memory 130. Setting aside for a moment read disturb, which may trigger a refresh based on the number of reads for memory cells that share a bitline, an age-based refresh schedule is often statically defined for a SSD based on the types of flash devices that are in use, with different flash manufacturers possibly specifying different retention ages for their flash dies. In this static case, a background process operating on a SSD may simply locate data stored in flash that is older than a threshold age, and refresh the stored data (e.g., by reading the stored data and programming the data to one or more erased flash pages). However, this type of refresh practice is not without its drawbacks. For instance, using an age-based approach may have to accept the worst-case scenario for temperature, p/e cycles, etc., in order to derive a worst-case maximum refresh period that ensures the integrity of the stored data. Yet, this type of approach generally results in a refresh schedule that is more aggressive than may be necessary. For example, memory cells with a low p/e count may have a lower charge leakage than memory cells with a higher p/e count. The result is that the memory cells with a lower p/e count may be refreshed more often than is necessary. In another example, the temperature of the dies on the SSD may be well below the worst-case scenario, thereby experiencing a lower charge leakage due to temperature effects. The result is that a refresh may occur more often than is necessary.

Since a refresh may involve a p/e cycle for blocks 138-139 in flash memory 130, it is desirable to reduce the refresh rate to minimize the number of p/e cycles. The embodiments described herein log retention parameters in journal 124 that allow for a more accurate decision regarding when to refresh data stored in flash memory 130. Further, the use of journal 124 allows for flash storage device 110 to tag or log different memory storage operations with the retention parameters that are associated with their respective write operations. This and other features of the subsequent embodiments will be discussed next.

Figure 2:
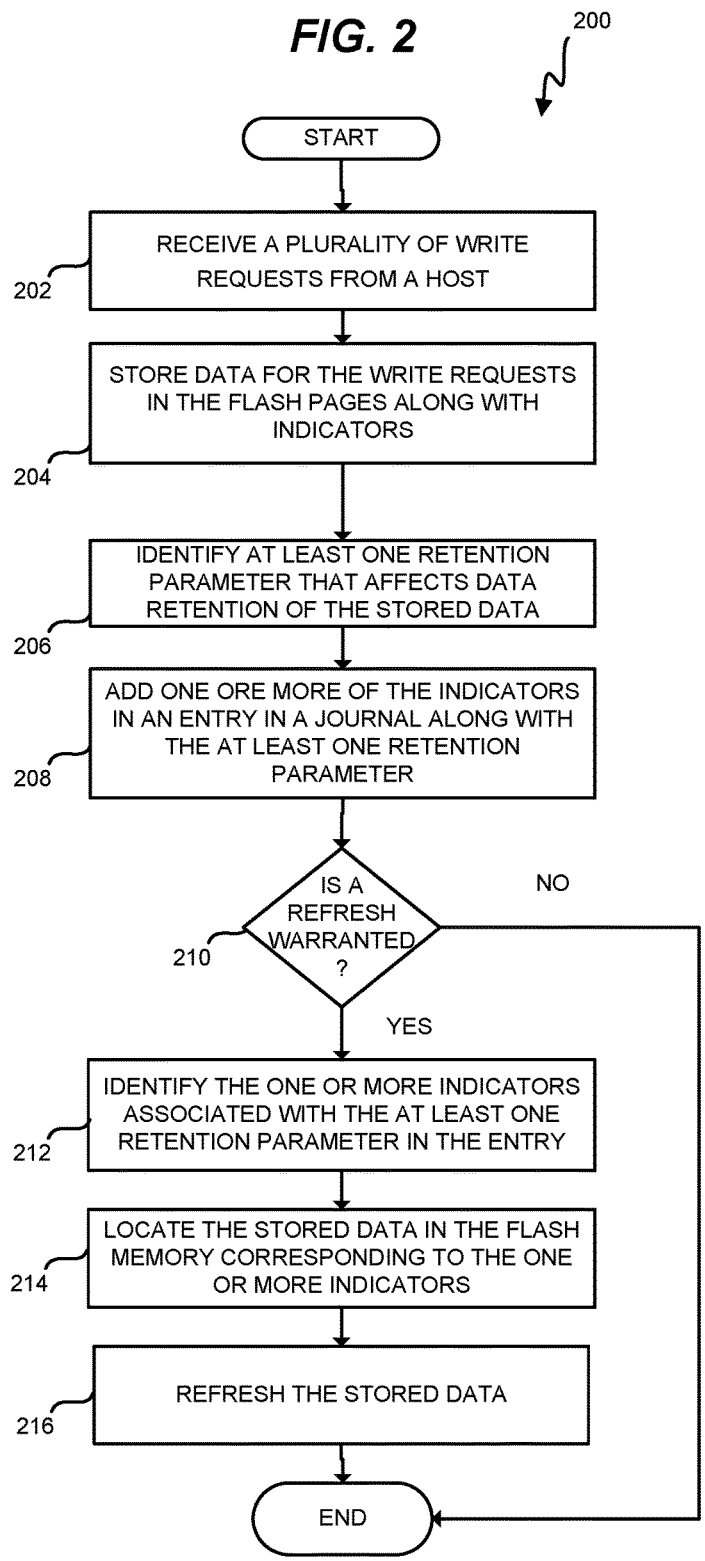
FIG. 2 is a flowchart of a method of monitoring data retention in flash memory in an exemplary embodiment.

Consider that flash storage device 110 is operational and in communication with host 102. FIG. 2 is a flowchart of a method 200 of monitoring data retention in flash memory in an exemplary embodiment. Method 200 will be discussed with respect to system 100 of FIG. 1, although method 200 may be performed by other systems, not shown. The steps of method 200 may include other steps, not shown. Also, the steps of method 200 may be performed in an alternate order.

During operation of system 100, host 102 may generate I/O requests for flash storage device 110. For instance, host 102 may generate a plurality of write requests to store data at flash storage device 110, which is received by controller 120 (e.g., via host interface 112, see step 202 of method 200). Controller 120 stores the data for the write request in flash pages 140-141 along with indicators (see step 204).

Figure 3:
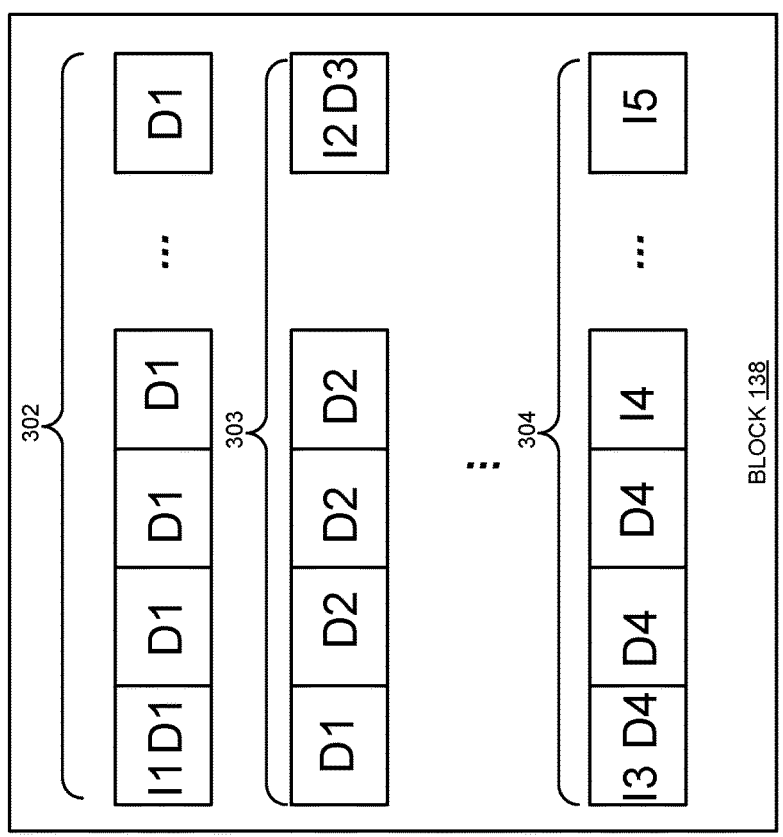
FIG. 3 illustrates a block of flash memory in an exemplary embodiment.

FIG. 3 illustrates block 138 of flash memory 130 in an exemplary embodiment. In this embodiment, block 138 includes a plurality of flash pages 302-304 that include indicators I1-I5. In some embodiments, indicators I1-I5 may be updated periodically. For example, controller 120 may update a value for indicators that are written to flash memory 130 every five minutes. As controller 120 receives asynchronous data for flash memory 130 from host 102, controller 120 writes the data to flash memory 130. In this embodiment, the values of the indicators written to flash memory 130 change based on a schedule (e.g., every five minutes). Thus, a variable amount of data may be written between two different indicator values. When the indicators are updated periodically, then it is possible to identify data written to flash memory 130 between two indicators as being temporally correlated. For example, if the indicators are updated every five minutes, then D1, D2, and D3 (see FIG. 3), which were written on or between I1 and I2, would be written within a five-minute time window.

In other embodiments, indicators may be updated based on the amount of data written to flash memory 130. For example, controller 120 may update a value for indicators that are written to flash memory 130 each time another 4K (4096 bytes) of data is written to flash memory 130. As controller 120 receives asynchronous data for flash memory 130 from host 102, controller 120 writes the data to flash memory 130. In this embodiment, the values of the indicators written to flash memory 130 change when another 4K of data is written to flash memory 130. Thus, a fixed amount of data is written between two different indicator values. When the indicators are updated based on the amount of data that is written, then it is possible to identify how much data has been written to flash memory 130 between to different indicators. For example, if the indicators are updated every time that 4K of data is written, then the aggregate of D1, D2, and D3 (see FIG. 3), which were written on or between I1 and I2, would be a total of 4K in size.

In some embodiments, a location in flash memory 130 of data stored between two indicators can be determined based on the values of the two indicators. For instance, knowing the pattern of how data is written to flash memory 130 along with the amount of data written between two indicators can be used to locate data in flash memory 130.

Controller 120 identifies at least one retention parameter that affects data retention of the stored data (see step 206). Controller 120 may determine the temperature of flash storage device 110, may determine the temperature of die 132, may determine the programming voltage(s) used to write data to block 138, may determine the p/e count for block 138, may determine how long block 138 has been open for writing, may determine the read disturb count of block 138, etc.

In response to determining the retention parameters, controller 120 adds one or more of the retention parameters to an entry in journal 124 (see step 208). For instance, controller 120 adds an entry in journal 124 that associates indicator I1 to one or more retention parameters.

FIG. 4 illustrates journal 124 in an exemplary embodiment. In this embodiment. Journal 124 includes a plurality of entries 406-411 that store indicators I1-I5 and retention parameters RP1-RP7. Journal 124 includes an indicator field 402, which stores indicators and a retention parameter field 404 that stores retention parameters RP1-RP7. In this embodiment, entry 406 stores indicator I1 and retention parameters RP1-RP3 that are correlated with I1. Entry 407 stores indicator I2 and retention parameter RP4 that is correlated with I2. Entry 408 stores indicator I3 and retention parameters RP5-RP6 that are correlated with I3. Entry 411 stores indicators I4-I5 and retention parameter RP7 that is correlated with I4-I5.

During operation, controller 120 may process journal 124 to determine if a refresh of data stored in flash memory 130 is warranted (see step 210). For example, controller 120 may process retention parameter field 404 for entries 406-411 to identify retention parameters RP1-RP7, and decide based on one or more of retention parameters RP1-RP7 whether a refresh of data is warranted. If for instance RP4 is an elevated temperature, and RP5 indicates that the temperature has returned to normal, then a refresh of D1-D3 may be warranted since D1-D3 were exposed to a higher than normal temperature at flash memory 130, which can affect the data retention of D1-D3.

If journal 124 indicates that a refresh is warranted, then controller 120 identifies an indicator located in journal 124 (e.g., indicators I1-I2; see step 212). Controller 120 locates the data stored in flash memory 130 that corresponds to the indicators (e.g., D1-D3; see step 214). For instance, controller 120 may process flash pages 302-304 in block 138 to locate a flash page that stores indicators I1-I2, and use this information to determine which flash pages 302-304 store data D1-D3.

Controller 120 refreshes the stored data located in flash memory 130 (see step 216). For instance, controller 120 may refresh data D1-D3 stored in block 138 by writing data D1-D3 to unused flash pages in flash memory 130. During the refresh process, controller 120 may capture a new set of retention parameters associated with copying data D1-D3 to a different block in flash memory 130, creating and storing a new indicator that links the new retention parameters to the newly copied data D1-D3.

In some embodiments, the retention parameters stored in journal 124 may trigger a retention test, which then may or may not result in a refresh. For example, the retention test may try to determine an amount of voltage shift in the memory cells. The retention parameters stored in journal 124 help in determining when to perform a voltage shift test on the memory cells.

The retention parameters in journal 124 may be useful in other ways. For instance, after a long duration the memory cell voltage may shift. The amount of shift may primarily depend on the duration, temperature during the duration, P/E cycle of the memory cell, etc. Knowing this information, controller 120 can compensate for the voltage shift by using specific read voltage thresholds when reading the memory cells. This minimizes errors and reduces error recovery attempts, which can result in better performance. The scenario is also useful is if flash storage device 110 is written with data and then flash storage device 110 turned off for an extended period of time. When flash storage device 110 is powered on there may be a large number of read errors due to the voltage shift. Without the retention parameters stored in journal 124, controller 120 may have to detect these errors and trigger retention test before it can compensate for the shift.

The use of entries in journal 124 that include unique indicators that are linked to retention parameters allows flash storage device 110 to perform a more thorough tracking of various retention parameters that are time-correlated with writing different streams or segments of data in flash memory 130. This technique allows flash storage device 110 to perform refresh operations on data stored in flash memory 130 in a more efficient manner, thereby potentially reducing the write amplification in flash memory 130. This improves the long term performance of flash storage device 110, and potentially provides a higher bandwidth to host 102 by reducing background processes that refresh data stored by flash memory 130.

Figure 5:
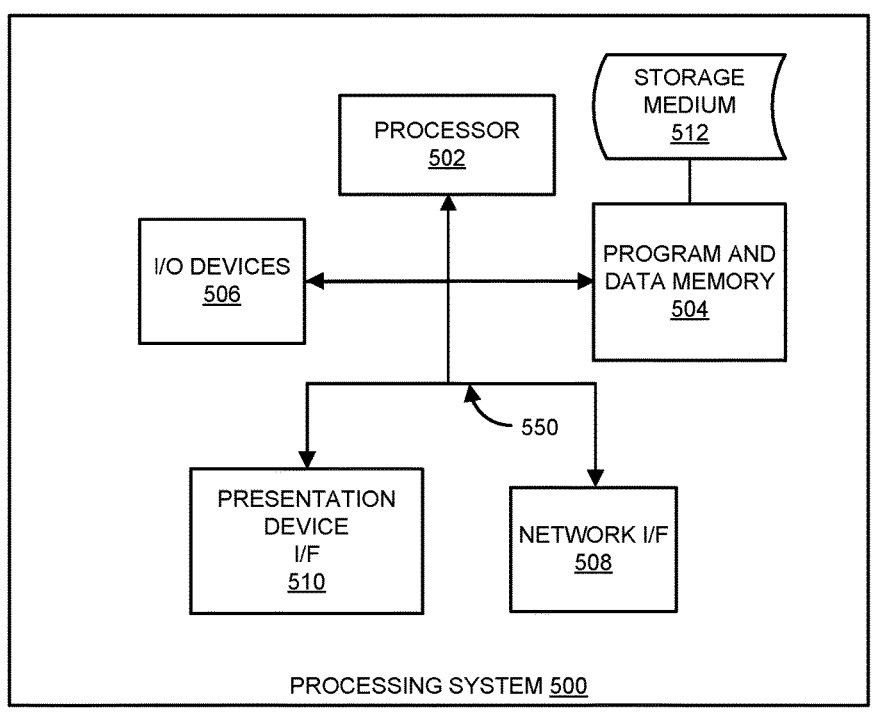
FIG. 5 illustrates a processing system that executes programmed instructions embodied on a computer readable medium to perform desired functions in an exemplary embodiment.

Controller 120 may perform the operations and functions described herein by executing one or more sequences of instructions stored on a machine/computer readable medium. Embodiments disclosed herein can take the form of software, hardware, firmware, or various combinations thereof to perform the various operations disclosed herein. FIG. 5 illustrates a processing system 500 that executes programmed instructions embodied on a computer readable medium to perform desired functions in an exemplary embodiment. Processing system 500 is operable to perform the above operations by executing programmed instructions tangibly embodied on computer readable storage medium 512. In this regard, embodiments of the invention can take the form of a computer program accessible via computer readable medium 512 that provides program code for use by a processor or any other instruction execution system. For the purposes of this description, computer readable storage medium 512 can be anything that can contain or store the program for use by the computer.

Computer readable storage medium 512 can be an electronic, magnetic, optical, or semiconductor device. Examples of computer readable storage medium 512 include a solid state memory, a magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), DVD, and Blu-ray. The terms tangible or non-transitory refer to the medium itself (i.e., tangible, not a signal) as opposed to a limitation on data storage persistency (e.g., RAM vs. ROM).

Processing system 500, being suitable for storing and/or executing the program code, includes at least one processor 502 coupled to program and data memory 504 through a system bus 550. Program and data memory 504 can include local memory employed during actual execution of the program code, bulk storage, and cache memories that provide temporary storage of at least some program code and/or data in order to reduce the number of times the code and/or data are retrieved from bulk storage during execution.

Input/output or I/O devices 506 (including but not limited to keyboards, displays, pointing devices, etc.) can be coupled either directly or through intervening I/O controllers. Network adapter interfaces 508 may also be integrated with the system to enable processing system 500 to become coupled to other data processing systems or storage devices through intervening private or public networks. Modems, cable modems, IBM Channel attachments, SCSI, Fibre Channel, and Ethernet cards are just a few of the currently available types of network or host interface adapters. Presentation device interface 510 may be integrated with the system to interface to one or more presentation devices, such as printing systems and displays for presentation of presentation data generated by the at least one processor 502.

What is claimed is:

1. A flash storage device comprising:
a flash memory having a plurality of non-volatile memory cells organized into blocks, wherein each of the blocks includes a plurality of pages of non-volatile memory cells; and
a controller communicatively coupled with the flash memory, the controller configured to receive a plurality of write requests from a host, to store data for the write requests in the plurality of pages along with indicators, to identify at least one retention parameter that affects data retention of stored data, and to add one or more of the indicators to an entry in a journal along with the at least one retention parameter,
wherein the controller, responsive to determining that a data refresh is warranted based on the at least one retention parameter in the entry of the journal, is further configured to identify one or more of the indicators associated with the at least one retention parameter in the entry, to locate the stored data in the flash memory corresponding to one or more of the indicators, and to refresh the stored data.

2. The flash storage device of claim 1, wherein new values for the indicators are generated periodically.

3. The flash storage device of claim 1, wherein new values for the indicators are generated based on an amount of data to be stored for the write requests.

4. The flash storage device of claim 3, wherein a location in the flash memory for data stored between two indicators is determined based on values of the two indicators.

5. The flash storage device of claim 1, wherein the at least one retention parameter is based on a program voltage utilized to store the data for the write requests.

6. The flash storage device of claim 1, wherein the at least one retention parameter is based on a temperature of the flash memory.

7. The flash storage device of claim 1, wherein the at least one retention parameter is based on a number of program/erase cycles for pages that store the data for the write requests.

8. The flash storage device of claim 1, wherein the at least one retention parameter is based on a duration that a block storing the data for the write requests has been open for writing.

9. The flash storage device of claim 1, wherein the at least one retention parameter is based on a number of read operations performed on a block storing the data for the write requests.

10. A method operable by a controller of a flash storage device that is communicatively coupled with a flash memory of the flash storage device, wherein the flash memory has a plurality of non-volatile memory cells organized into blocks, wherein each of the blocks includes a plurality of pages of non-volatile memory cells, the method comprising:
receiving a plurality of write requests from a host;
storing data for the write requests in the plurality of pages along with indicators;
identifying at least one retention parameter that affects data retention of stored data;
adding one or more of the indicators in an entry in a journal along with the at least one retention parameter;
responsive to determining that a data refresh is warranted based on the at least one retention parameter in the entry of the journal:
identifying one or more of the indicators associated with the at least one retention parameter in the entry;

locating storage data in the flash memory corresponding to one or more of the indicators; and
refreshing the stored data.

11. The method of claim 10, wherein new values for the indicators are generated periodically.

12. The method of claim 10, wherein new values for the indicators are generated based on an amount of data to be stored for the write requests.

13. The method of claim 12, wherein a location in the flash memory for data stored between two indicators is determined based on values of the two indicators.

14. The method of claim 10, wherein the at least one retention parameter is based on a program voltage utilized to store the data for the write requests.

15. The method of claim 10, wherein the at least one retention parameter is based on a temperature of the flash memory.

16. The method of claim 10, wherein the at least one retention parameter is based on a number of program/erase cycles for pages that store the data for the write requests.

17. The method of claim 10, wherein the at least one retention parameter is based on a duration that a block storing the data for the write requests has been open for writing.

18. The method of claim 10, wherein the at least one retention parameter is based on a number of read operations performed on a block storing the data for the write requests.

19. A non-transitory computer readable medium embodying programmed instructions which, when executed by a controller of a flash storage device that is communicatively coupled with a flash memory of the flash storage device, wherein the flash memory has a plurality non-volatile memory cells organized into blocks, wherein each of the blocks includes a plurality of pages of the non-volatile memory cells, direct the controller to:
  receive a plurality of write requests from a host;
  store data for the write requests in the pages along with indicators;
  identify at least one retention parameter that affects data retention of the stored data;
  add one or more of the indicators in an entry in a journal along with the at least one retention parameter;
  responsive to determining that a data refresh is warranted based on the at least one retention parameter in the entry of the journal:
    identify one or more of the indicators associated with the at least one retention parameter in the entry;
    locate the stored data in the flash memory corresponding to one or more of the indicators; and
    refresh the stored data.

20. The non-transitory computer readable medium of claim 19, wherein new values for the indicators are generated periodically.

21. The non-transitory computer readable medium of claim 19, wherein new values for the indicators are generated based on an amount of data to be stored for the write requests.

22. The non-transitory computer readable medium of claim 21, wherein a location in the flash memory for data stored between two indicators is determined based on values of the two indicators.

23. The non-transitory computer readable medium of claim 19, wherein the at least one retention parameter is based on a program voltage utilized to store the data for the write requests.

24. The non-transitory computer readable medium of claim 19, wherein the at least one retention parameter is based on a temperature of the flash memory.

25. The non-transitory computer readable medium of claim 19, wherein the at least one retention parameter is based on a number of program/erase cycles for pages that store the data for the write requests.

26. The non-transitory computer readable medium of claim 19, wherein the at least one retention parameter is based on a duration that a block storing the data for the write requests has been open for writing.

27. The non-transitory computer readable medium of claim 19, wherein the at least one retention parameter is based on a number of read operations performed on a block storing the data for the write requests.

* * * * *